(12) United States Patent
Araya et al.

(10) Patent No.: US 6,208,482 B1
(45) Date of Patent: Mar. 27, 2001

(54) SIGNAL AMPLIFYING CIRCUIT FOR AN MR ELEMENT

(75) Inventors: Yukihiro Araya; Takehiko Umeyama, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/329,233

(22) Filed: Jun. 10, 1999

(30) Foreign Application Priority Data

Dec. 25, 1998 (JP) .................................................. 10-369656

(51) Int. Cl.[7] ................ G11B 5/02; G11B 5/09; G11B 15/12

(52) U.S. Cl. .................. 360/67; 360/46; 360/61

(58) Field of Search ................................. 360/46, 67, 61; 330/62

(56) References Cited

U.S. PATENT DOCUMENTS 5,757,566    5/1998    Ngo et al. ............................... 360/67

*Primary Examiner*—Nabil Hindi
*Assistant Examiner*—Regina Y. Neal
(74) *Attorney, Agent, or Firm*—Leydig, Voit & Mayer, Ltd.

(57) ABSTRACT

A signal amplifying circuit for an MR element in which a first terminal of a selected MR element is connected to input of an amplifier through a first resistor as well as to a second input of the amplifier through a second resistor, and a second terminal of the MR element is connected to the input of the amplifier through a capacitor. The effect of an offset voltage generated in the MR element can be suppressed to minimum with a simple configuration.

7 Claims, 5 Drawing Sheets

US 6,208,482 B1

SIGNAL AMPLIFYING CIRCUIT FOR AN MR ELEMENT

FIELD OF THE INVENTION

The present invention relates to a signal amplifying circuit for an MR element, and more particularly relates to a configuration of a signal amplifying circuit for an MR element for reducing the influence of a DC current offset voltage to the minimum at the time of amplification of signals.

BACKGROUND OF THE INVENTION

In recent years, an MR (magnetoresistive) element has been used as an element for the head of a magnetic recording medium such as a hard disk drive (HDD) and a floppy disk drive FDD). The head that uses an MR element has a larger output for reproduction as compared to a head that uses a conventional thin-film element, therefore, disk recording density of the magnetic recording medium can largely improve.

Herein the MR element according to the present invention means an element that shows a magnetoresistive (MR) effect in which resistance of the element varies when an external magnetic field is applied to the element. Examples of such elements are a GMR (giant magnetoresistive) element or a TMR (tunneling magnetoresistive) element.

FIG. 9 shows configuration of a signal amplifying circuit for an MR element based on the conventional technology.

In FIG. 9, designated at the reference numeral 1a is a first MR element, at 1b a second MR element, at 2a and 2a' a pair of first switching circuits, at 2b and 2b' another pair of first switching circuits, at 2c and 2c' a pair of second switching circuits, at 3 a constant current source, at 4 an amplifier, at V1 a first potential (a power-supply potential in FIG. 9), at V2 a second potential (a ground potential in FIG. 9), at MR1 a first terminal of an MR element, at MR2 a second terminal of the MR element, at OUT1 a first output terminal of the amplifier 4, and at OUT2 a second output terminal of the amplifier 4, respectively.

Next, operation of the signal amplifying circuit for an MR element shown in FIG. 9 is described.

The first switching circuits 2a, 2a' and the other first switching circuits 2b, 2b' are paired, respectively. Those first switching circuits operate in such a way that, when one of the paired switching circuits (e.g., 2a) is ON the other (e.g., 2a') is also ON, and when one of the paired switching circuits is OFF the other is also OFF. Further, those switching circuits are controlled by a control circuit not shown in the figure such that when the first switching circuits 2a, 2a' are ON the other first switching circuits 2b, 2b' are OFF, and when the first switching circuits 2a, 2a' are OFF the other first switching circuits 2b, 2b' are ON. Through the controls provided as described above, a current is supplied to either the first MR element 1a or the second MR element 1b.

Furthermore, the second switching circuits 2c, 2c' are paired, and controls are provided by the control circuit not shown in the figure such that when the first switching circuits 2a, 2a' are ON the second switching circuits 2c, 2c' are connected to respective terminals a, and when the other first switching circuits 2b, 2b' are ON the second switching circuits 2c, 2c' are connected to respective terminals b.

Next, description is made the operation when the first MR element 1a is selected (when the first switching circuits 2a, 2a' are ON). In this case, as described above, the other first switching circuits 2b, 2b' are OFF, and further the second switching circuits 2c, 2c' are connected to respective terminals a. Therefore, a current is supplied to the first MR element 1a from a power supply unit as the first potential V1 through the first terminal MR1 of the MR element by the constant current source 3. The first terminal MR1 and the second terminal MR2 of the first MR element 1a are connected to respective inputs of the amplifier 4 and, a signal from the first MR element 1a is amplified by the amplifier 4 and outputted from the first output terminal OUT1 as well as the second output terminal OUT2 of the amplifier 4.

FIG. 10 shows a configuration using emitter-follower transistor circuits for the components corresponding to the pair of second switching circuits 2c, 2c' in the conventional signal amplifying circuit for an MR element in FIG. 9. In FIG. 10, the reference numerals are assigned to the same sections corresponding to those in FIG. 9.

In FIG. 10, the first terminal MR1 of the first MR element 1a is connected to the base of a NPN transistor Tr1, and the second terminal MR2 of the MR element is connected to the base of a NPN transistor Tr2, and the emitter of the NPN transistor Tr1 and the emitter of the NPN transistor Tr2 are connected to respective inputs of the amplifier 4.

The conventional of signal amplifying circuit for an MR element in FIG. 10 performs the same operation as that of the circuit in FIG. 9, but comprises the emitter-follower transistor circuit for the components corresponding to the second switching circuits 2c, 2c', thus the circuit operates such that signals of an MR element selected by the first switching circuits 2a, 2a' or by the other first switching circuits 2b, 2b' are inputted into the amplifier 4 as they are.

However, the conventional signal amplifying circuit for an MR element described above has drawbacks. Namely, in the conventional signal amplifying circuit for an MR element, signals comprising DC and AC current components obtained from both the terminals of the MR element are directly inputted into the amplifier, so that, when an offset voltage (voltage difference) arises in the signals from the MR element, an imbalance arises at the two inputs of the amplifier. Therefore, the dynamic range becomes narrow or amplification of a weak signal cannot accurately be performed.

SUMMARY OF THE INVENTION

The present invention is made for solving the problems described above, and it is an object of the present invention to provide a signal amplifying circuit for an MR element which can amplify signals with high precision even when there occurs an offset in the voltage of the signals from an MR element.

In the signal amplifying circuit for an MR element according to the present invention, a first terminal of a selected MR element is connected to one input of an amplifier through a first resistor and the second terminal of the selected MR element is connected to the other input of the amplifier through a second resistor, further, the second terminal of the selected MR element is connected to the other input of the amplifier through a capacitor. Thus, when the first MR element 1a is biased, the inputs of the amplifier are also biased, further, the DC current component of the MR element is cut and only the AC current component is inputted into the other input of the amplifier.

Other objects and features of this invention will become apparent from the following description with reference to the accompanying drawings.

DESCRIPTION OF THE PREFERRED EMBODIMENTS

Figure 1:
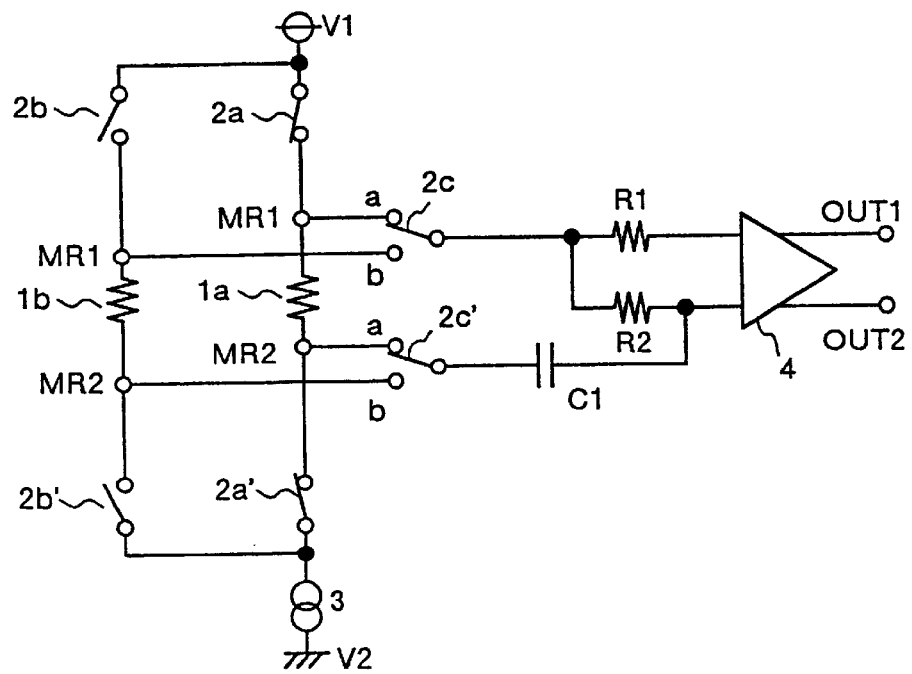
FIG. 1 is a circuit diagram showing Embodiment 1 of a signal amplifying circuit for an MR element according to the present invention.
Figure 2:
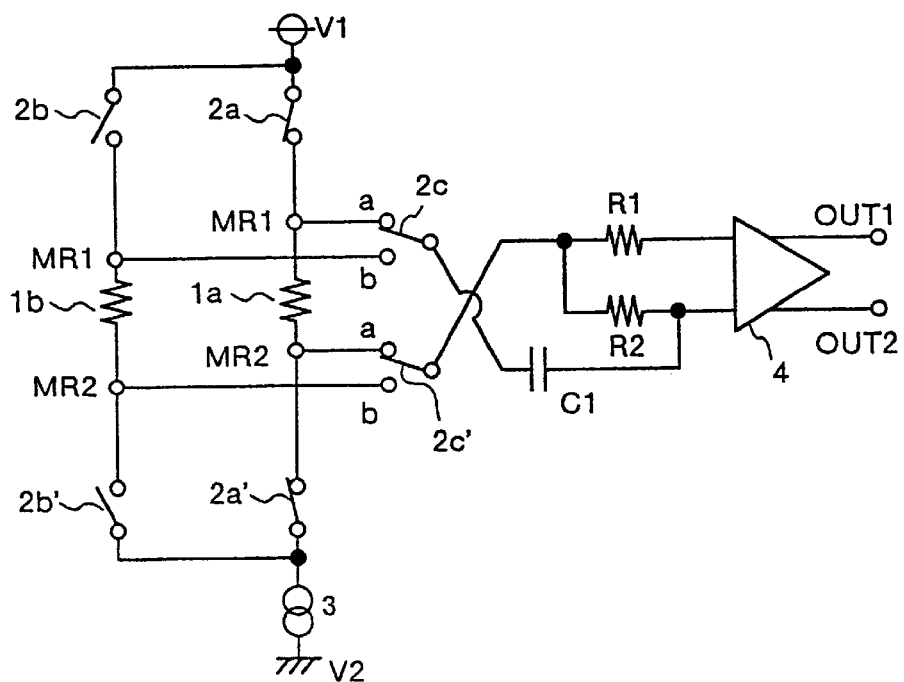
FIG. 2 is another circuit diagram showing Embodiment 1 of the signal amplifying circuit for an MR element according to the present invention.

Description is made for Embodiment 1 with reference to FIG. 1 and FIG. 2.

Figure 9:
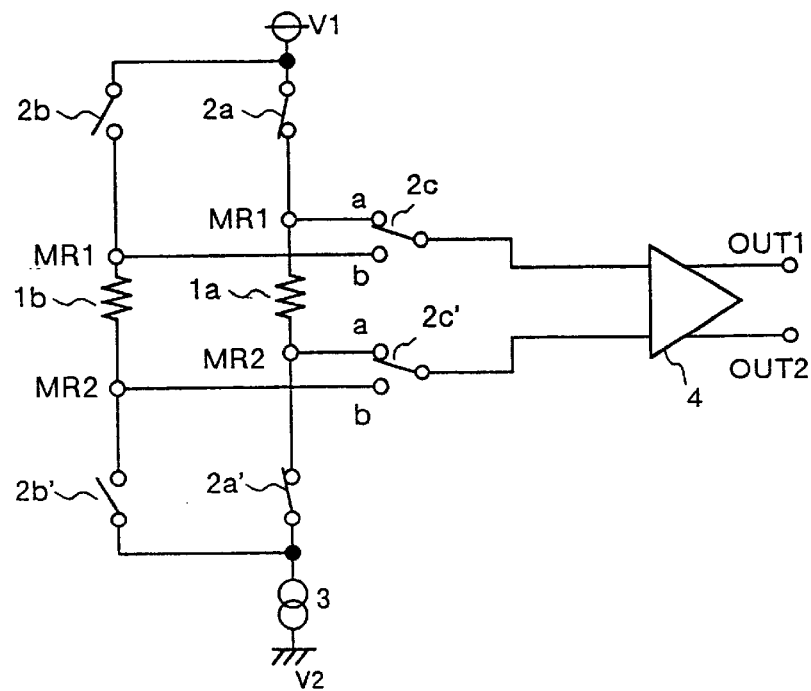
FIG. 9 is a circuit diagram showing the signal amplifying circuit for an MR element based on the conventional technology.

In FIG. 1, designated at the reference numeral 1a is a first MR element, at 1b a second MR element, at 2a and 2a' a pair of first switching circuits, at 2b and 2b' a pair of another first switching circuits, at 2c and 2c' a pair of second switching circuits, at 3 a constant current source for MR elements, at 4 an amplifier, at V1 a first potential (a power-supply potential in FIG. 1), at V2 a second potential (a grounded potential in FIG. 1), at MR1 a first terminal for an MR element, at MR2 a second terminal for the MR element, at OUT1 a first output terminal of the amplifier 4, and at OUT2 a second output terminal of the amplifier 4, respectively. Those components described above are the same as for the conventional signal amplifying circuit shown in FIG. 9. Further, designated at the reference numeral C1 is a first capacitor, at R1 a first resistor, and at R2 a second resistor, respectively.

Next, operation of the signal amplifying circuit for an MR element shown in FIG. 1 is described.

The first switching circuits 2a, 2a' and the other first switching circuits 2b, 2b' are paired respectively. Those first switching circuits operate in such a way that, when one of the paired switching circuits (e.g., 2a) is ON the other (e.g., 2a') is also ON, and when one of the paired switching circuits is OFF the other is also OFF. Further, those switching circuits are controlled by a control circuit not shown in the figure such that, when the first switching circuits 2a, 2a' are ON the other first switching circuits 2b, 2b' are OFF, and when the first switching circuits 2a, 2a' are OFF the other first switching circuits 2b, 2b' are ON. Through the controls provided as described above, a current is supplied to either the first MR element 1a or the second MR element 1b.

Furthermore, the second switching circuits 2c, 2c' are paired, and controls are provided by the control circuit not shown in the figure such that, when the first switching circuits 2a, 2a' are ON the second switching circuits 2c, 2c' are connected to terminals a, and when the other first switching circuits 2b, 2b' are ON the second switching circuits 2c, 2c' are connected to respective terminals b respectively.

Next, description is made the operation when the first MR element 1a is selected (when the first switching circuits 2a, 2a' are ON). In this case, as described above, the other first switching circuits 2b, 2b' are OFF, and further the second switching circuits 2c, 2c' are connected to the respective terminals a. Therefore, a current is supplied to the first MR element 1a from a power supply unit, as the first potential V1, through the first terminal MR1 of the MR element by the constant current source 3. The operation described so far is the same as that shown in FIG. 9, the example based on the conventional technology.

Then, a signal from the first MR element 1a is inputted into one input of the amplifier 4 from the first terminal MR1 of the MR element through the switching circuit 2c and the resistor R1, and also inputted into the other input of the amplifier 4 through the resistor R2.

Further, a signal from the first MR element 1a is inputted into the other input of the amplifier 4 from the second terminal MR2 of the MR element through the switching circuit 2c' and the first capacitor C1.

The amplifier 4 receives those signals, amplifies and outputs the signals to the first output terminal OUT1 as well as to the second output terminal OUT2.

Herein, the signal from the first terminal MR1 of the first MR element 1a is inputted into one input as well as into the other input of the amplifier 4 through the resistor R1 and resistor R2 respectively. Therefore, when the first MR element 1a is biased, the inputs of the amplifier 4 are concurrently biased. Accordingly, there is no need to provide a separate circuit for the particular purpose of bias.

The signal from the second terminal MR2 of the first MR element 1a is inputted into the other input of the amplifier 4 through the first capacitor C1. Therefore, the DC current component from the MR element 1a is blocked and only the AC current component is inputted into the other input of the amplifier 4.

Accordingly, even if an offset voltage arises between the signal from the first terminal MR1 and the signal from the second terminal MR2 of the MR element, a biased voltage is supplied to the inputs of the amplifier 4 by the signal from the first terminal MR2, and further only the AC current component is supplied to the other input of the amplifier 4 by the signal from the second terminal MR1. Therefore, the amplifier 4 is not affected by the generated offset voltage which allows a desired output to be obtained from each of the output terminals of the amplifier 4.

As described above, by sending signals from the MR element to the amplifier provided in the next stage with a comparatively simple configuration in which two resistors and one capacitor are provided without provision of a bias circuit therein, it is possible to obtain desired high-precision signals which are not affected by an offset voltage.

Even if this embodiment is configured as shown in FIG. 2, the same effect can be obtained as described above.

Namely, the configuration shown in FIG. 2 is different from the one shown in FIG. 1 in that the components are connected such that the signal from the second terminal MR2 of the first MR element 1a and the signal from the first terminal MR1 thereof are exchanged when inputting into the amplifier 4.

In this configuration in FIG. 2, the signal from the second terminal MR2 is also inputted into one input as well as the other input of the amplifier 4 through the resistor R1 and the resistor R2 respectively. Therefore, when the first MR element 1a is biased, the inputs of the amplifier 4 are also biased. Accordingly, there is no need to provide a separate circuit for the particular purpose of bias.

The signal from the first terminal MR1 of the first MR element 1a is inputted into the other input of the amplifier 4 through the first capacitor C1. Therefore, the DC current component of the MR element is blocked and only the AC current component is inputted into the other input of the amplifier 4.

Accordingly, even if an offset voltage arises between the signal from the first terminal MR1 and the signal from the second terminal MR2, a bias voltage is supplied to the inputs of the amplifier 4 by the signal from the first terminal MR1, and only the AC current component is supplied to the other input of the amplifier 4 by the signal from the second terminal MR2. Therefore, the amplifier 4 is not affected by the generated offset voltage which allows a desired output to be obtained from each of the output terminals of the amplifier 4.

Figure 3:
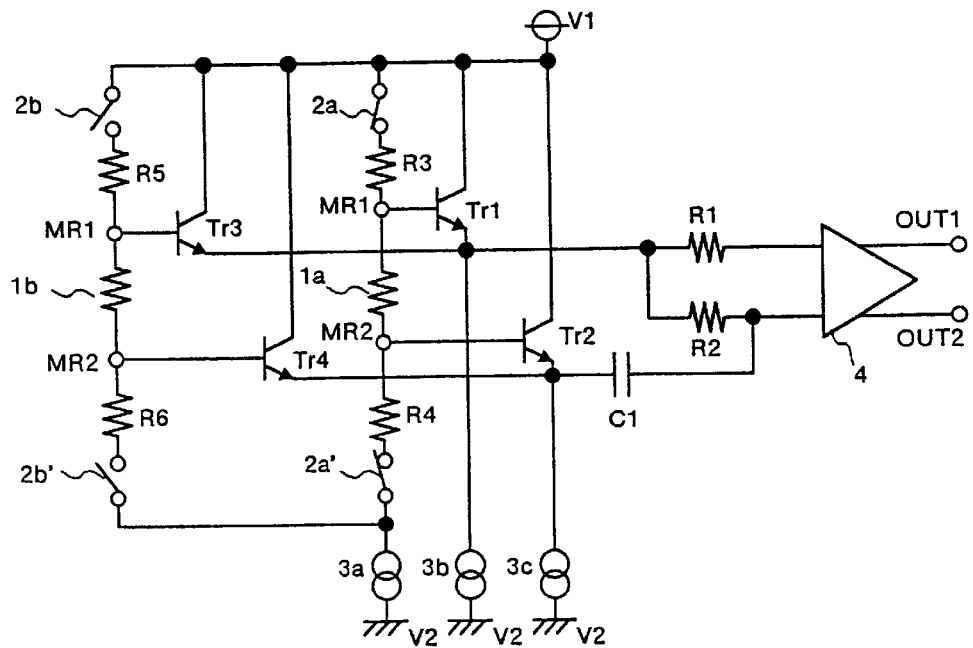
FIG. 3 is a circuit diagram showing Embodiment 2 of a signal amplifying circuit for an MR element according to the present invention.

Description is made for Embodiment 2 with reference to FIG. 3.

The configuration in FIG. 3 is different from that in FIG. 1 in the provision of an overcurrent protection resistor R3 between the first terminal MR1 of the first MR element 1a and the first potential V1, an overcurrent protection resistor R4 between the second terminal MR2 of the first MR element 1a and the second potential V2, an overcurrent protection resistor R5 in between the first terminal MR1 of the second MR element 1b and the first potential V1, and an overcurrent protection resistor R6 between the second terminal MR2 of the second MR element 1b and the second potential V2, respectively.

Figure 10:
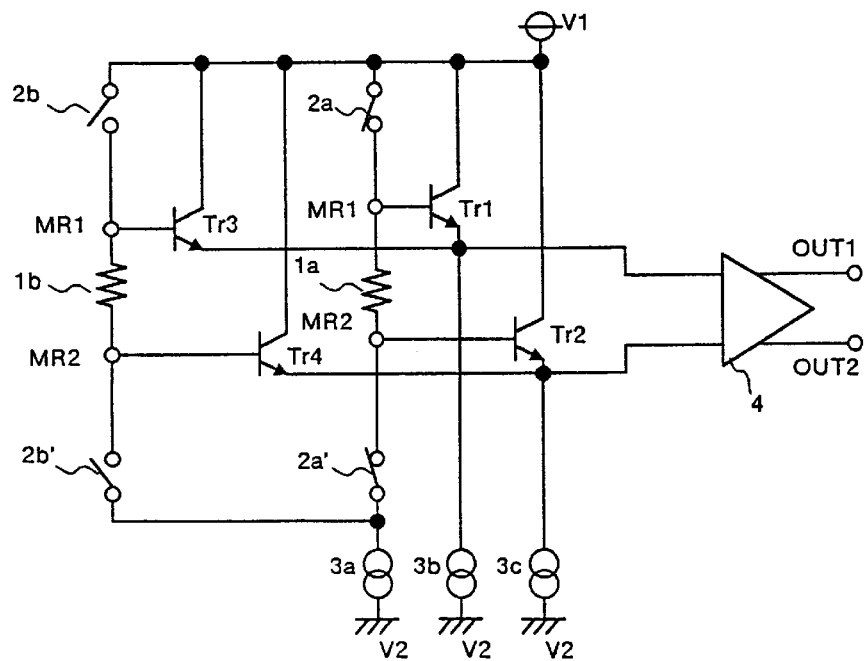
FIG. 10 is another circuit diagram showing the signal amplifying circuit for an MR element based on the conventional technology.

Further, the configuration in FIG. 3 is different in that components corresponding to the second switching circuits 2c, 2c' in FIG. 1 comprise emitter-follower circuits transistors Tr1 to Tr4, which is similar to FIG. 10, the example based on the conventional technology.

In FIG. 3, although the basic operation is the same as that in FIG. 1, even if an over current arises, the MR element can be protected by the overcurrent protection resistors R3 to R6.

Since the emitter-follower type of transistors Tr1 to Tr4 are provided as the second switching circuits, the operation can be so performed that the signals from the MR element selected by the first switching circuits 2a, 2a' or the other first switching circuits 2b, 2b' can be inputted into the amplifier 4 as they are.

Figure 4:
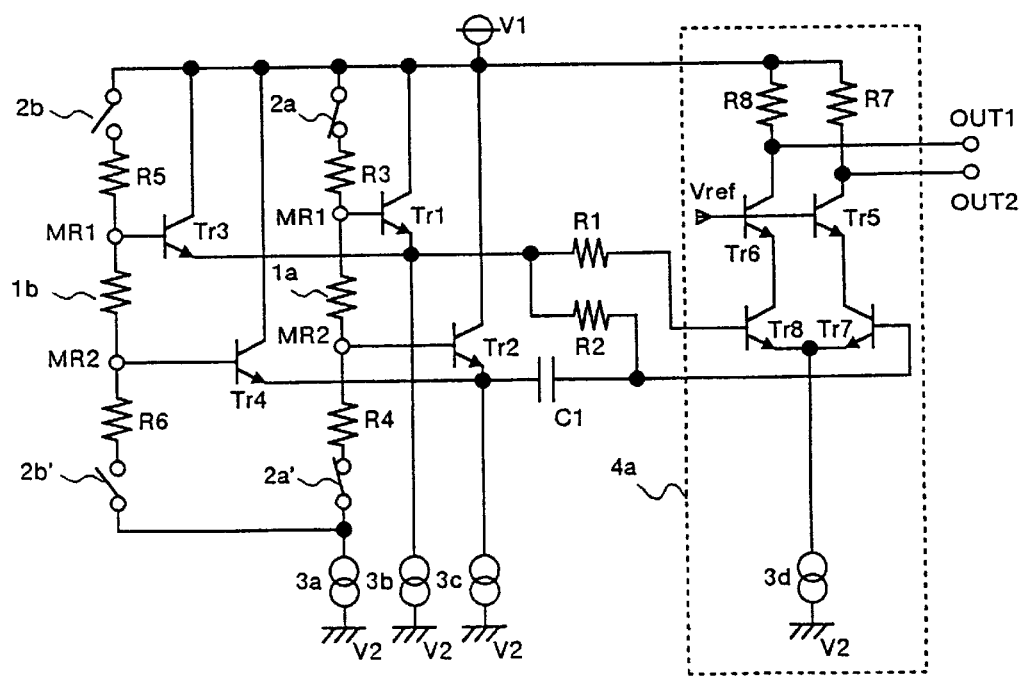
FIG. 4 is a circuit diagram showing Embodiment 3 of a signal amplifying circuit for an MR element according to the present invention.
Figure 5:
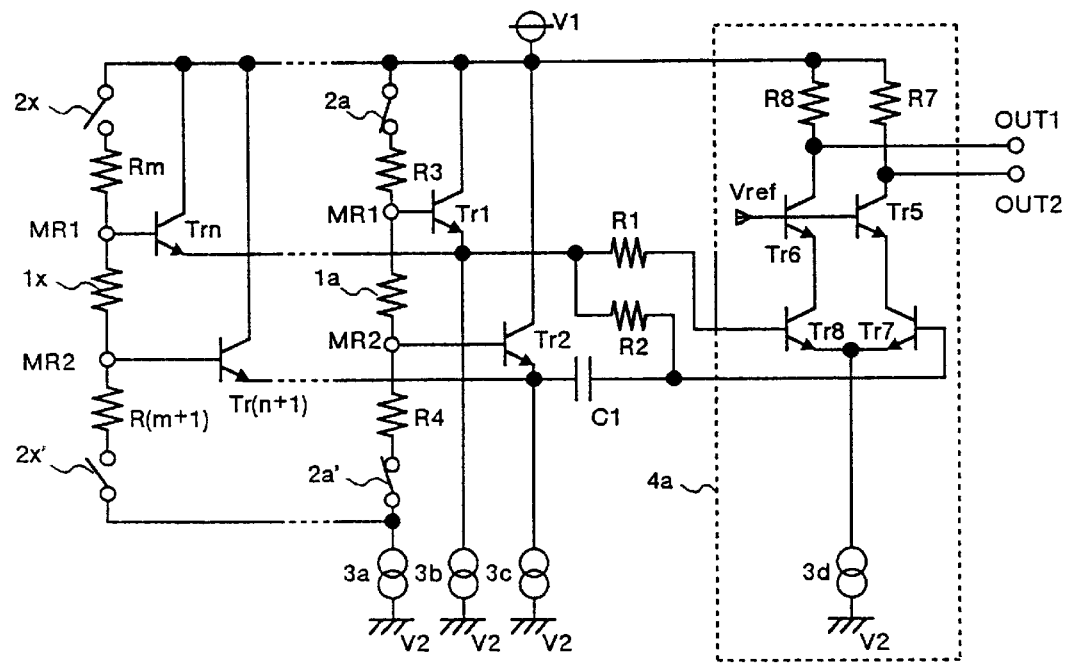
FIG. 5 is another circuit diagram showing Embodiment 3 of the signal amplifying circuit for an MR element according to the present invention.

Description is made for Embodiment 3 with reference to FIG. 4 and FIG. 5.

FIG. 4 is a view showing an amplifier using a cascade differential amplifier 4a as a concrete example of the amplifier 4 in FIG. 3.

Herein, the cascade differential amplifier is referred to a configuration obtained by including a cascade circuit in which an emitter grounding circuit drives a base grounded circuit in the differential amplifier.

The cascade differential amplifier 4a is so configured that one input and the other input of the amplifier are connected to the bases of a pair of NPN transistors Tr7, Tr8 connected to a constant current source 3d through commonly connected emitters of the transistors, respectively, the collectors of the NPN transistors Tr7, Tr8 are connected to the emitters of NPN transistors Tr5, Tr6 with the bases thereof connected to a reference voltage Vref, respectively, and further a first output terminal OUT1 and a second output terminal OUT2 are connected to the node of the collectors of the NPN transistors Tr5, Tr6 and first ends of the resistors R7, R8. The second ends of the resistors R7, R8 are connected to the first potential V1.

The cascade differential amplifier 4a configured as described above is characterized in that a frequency characteristic can be improved because the base grounded circuit having a wide-band characteristic is driven by the emitter grounded circuit, which is a characteristic of the cascade type of amplifier.

FIG. 5 shows the signal amplifying circuit comprising three or more MR elements in contrast to the signal amplifying circuit comprising two MR elements shown in FIG. 4.

The operation and effect of this circuit are the same as those of the circuit shown in FIG. 4, so that description thereof is omitted herein.

Figure 6:
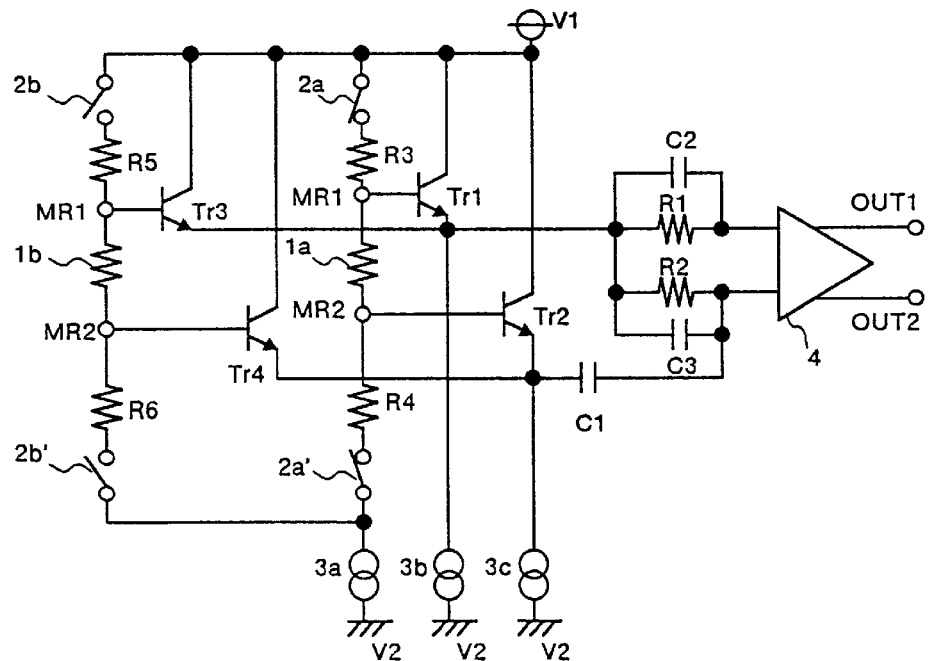
FIG. 6 is a circuit diagram showing Embodiment 4 of a signal amplifying circuit for an MR element according to the present invention.
Figure 7:
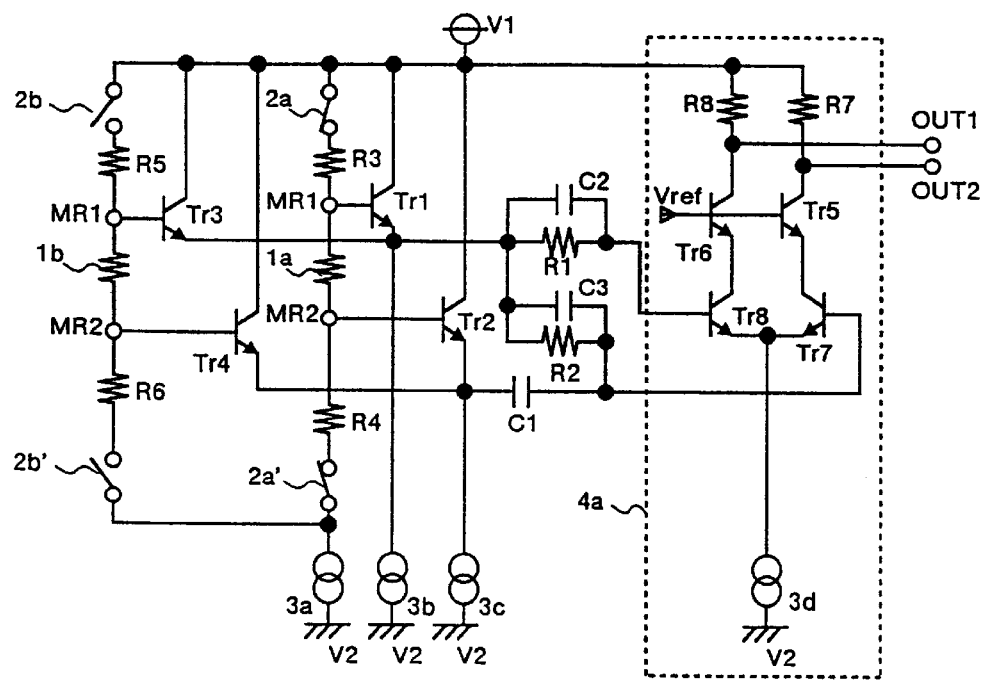
FIG. 7 is another circuit diagram showing Embodiment 4 of the signal amplifying circuit for an MR element according to the present invention.
Figure 8:
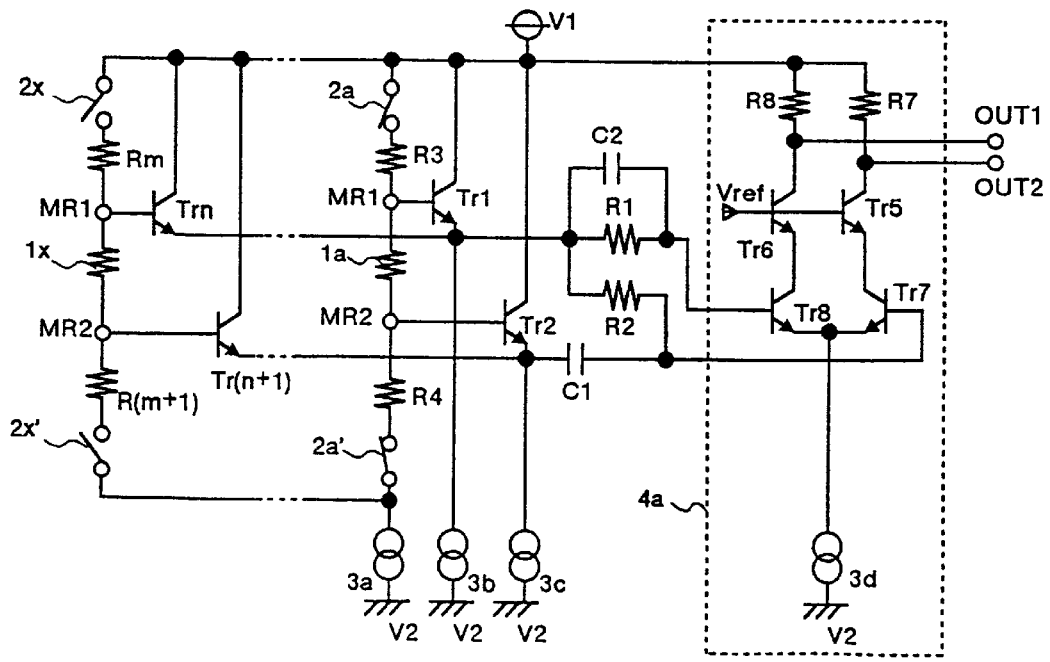
FIG. 8 is another circuit diagram showing Embodiment 4 of the signal amplifying circuit for an MR element according to the present invention.

Description is made for Embodiment 4 with reference to FIG. 6, FIG. 7, and FIG. 8.

In FIG. 6, the connection of the first terminal MR1 and the second terminal MR2 of the first MR element 1a to the amplifier 4 is different as compared to that shown in FIG. 3. Namely, a second capacitor C2 is connected in parallel to the first resistor R1, and a third capacitor C3 is connected in parallel to the second resistor R2.

In accordance with the configuration described above, it is possible to reduce the influence of thermal noise caused by variation in temperature arising in the first resistor R1 and second resistor R2.

FIG. 7 shows a signal amplifying circuit for an MR element with a cascade differential amplifier 4a used in place of the amplifier 4 in FIG. 6.

The operation and effect of the circuit in FIG. 7 are the same as those of the circuit shown in FIG. 6, so that detailed description thereof is omitted herein. The operation and effect of the cascade type of differential amplifier 4a are also the same as those in Embodiment 3, so that detailed description thereof is omitted herein.

FIG. 8 shows a circuit in which the second capacitor C2 is provided only for the first resistor R1 in contrast to the circuit shown in FIG. 7 in which the second capacitor C2 and third capacitor C3 for removing thermal noise are provided for both of the first resistor R1 and second resistor R2. When the circuit is integrated, capacitors requiring comparatively large area can be reduced and, even if the circuit is configured as shown in FIG. 8, some of thermal noise can be removed. The same effect can naturally be obtained even if the second capacitor C2 is connected in parallel only to the second resistor R2.

Further, FIG. 8 shows the signal amplifying circuit comprising three or more MR elements in contrast to the signal amplifying circuit comprising two MR elements shown in FIG. 7.

As described above, in accordance with the present invention, a signal is inputted into one input of an amplifier from the first terminal of an MR element through a first resistor, and further signals are inputted into the other input of the amplifier from the first terminal of the MR element through a second resistor as well as from the second terminal of the MR element through a capacitor, so that it is possible to obtain an amplifying circuit for an MR element that is not affected by an offset voltage with a comparatively simple configuration.

In accordance with the present invention, a second switching circuit comprises emitter-follower type of transistors, so that the configuration thereof is comparatively simple.

In accordance with the present invention, the amplifier is a cascade type of differential amplifier, so that it is possible to obtain a signal amplifying circuit for an MR element which is excellent in the frequency characteristic.

In accordance with the present invention, a second capacitor, or the second capacitor and a third capacitor are connected in parallel to at least either of the first resistor and the second resistor, so that it is possible to obtain a signal amplifying circuit for an MR element which is least affected by thermal noise.

This application is based on Japanese patent application No. HEI 10-369656 filed in the Japanese Patent Office on Dec. 25, 1998, the entire contents of which are hereby incorporated by reference.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A signal amplifying circuit for an MR element comprising:
    a plurality of MR elements, each MR element having first and second terminals,
    a first switching circuit for selectively supplying a current to one of the plurality of MR elements,
    a second switching circuit for selecting the MR element to which a current is selectively supplied, and
    an amplifier having first and second inputs for respectively receiving signals outputted from the first and second terminals of the MR element selected by the second switching circuit, wherein a signal is inputted into the first input of the amplifier from the first terminal of the MR element selected, through a first resistor, and signals are inputted into the second input of the amplifier from the first terminal of the MR element selected, through a second resistor and from the second terminal of the MR element selected, through a capacitor.

2. The signal amplifying circuit for an MR element according to claim 1 wherein the second switching circuit comprises
    a first transistor having a base connected to the first terminal of the MR element selected and an emitter connected to the first resistor and to the second resistor; and
    a second transistor having a base connected to the second terminal of the MR element selected and an emitter connected to the capacitor.

3. The signal amplifying circuit for an MR element according to claim 1 wherein the amplifier is a cascade differential amplifier.

4. The signal amplifying circuit for an MR element according to claim 1 including a second capacitor connected in parallel with at least one of the first resistor and the second resistor.

5. The signal amplifying circuit for an MR element according to claim 1 including a second capacitor and a third capacitor connected in parallel with at least one of the first resistor and the second resistor.

6. A signal amplifying circuit for an MR element comprising:
    a plurality of MR elements, each MR element having first and second terminals,
    a first switching circuit for selectively supplying a current to one of the plurality of MR elements,
    a second switching circuit for selecting the MR element to which a current is selectively supplied, and
    an amplifier having first and second inputs for respectively receiving signals outputted from the first and second terminals of the MR element selected by the second switching circuit, wherein a signal is inputted into the first input of the amplifier from the second terminal of the MR element selected, through a first resistor, and signals are inputted into the second input of the amplifier from the second terminal of the MR element selected, through a second resistor and from the first terminal of the MR element selected, through a capacitor.

7. The signal amplifying circuit for an MR element according to claim 6 wherein the second switching circuit comprises
    a first transistor having a base connected to the first terminal of the MR element selected and an emitter connected to the capacitor; and
    a second transistor having a base connected to the second terminal of the MR element selected and an emitter connected to the first resistor and to the second resistor.

* * * * *